United States Patent
Liu et al.

(10) Patent No.: US 10,751,933 B2
(45) Date of Patent: Aug. 25, 2020

(54) TECHNIQUE FOR THREE-DIMENSIONAL NANOPRINTING

(71) Applicant: The Regents of the University of California, Oakland, CA (US)

(72) Inventors: Gang-Yu Liu, Davis, CA (US); Jianli Zhao, Cypress, CA (US); Logan A. Swartz, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 107 days.

(21) Appl. No.: 15/767,967

(22) PCT Filed: Dec. 13, 2016

(86) PCT No.: PCT/US2016/066398
§ 371 (c)(1),
(2) Date: Apr. 12, 2018

(87) PCT Pub. No.: WO2017/106199
PCT Pub. Date: Jun. 22, 2017

(65) Prior Publication Data
US 2018/0297270 A1  Oct. 18, 2018

Related U.S. Application Data

(60) Provisional application No. 62/268,299, filed on Dec. 16, 2015.

(51) Int. Cl.
*B33Y 40/20* (2020.01)
*B29C 64/112* (2017.01)
(Continued)

(52) U.S. Cl.
CPC .......... *B29C 64/112* (2017.08); *B29C 64/188* (2017.08); *B29C 64/35* (2017.08);
(Continued)

(58) Field of Classification Search
CPC ... B29C 64/106; B29C 64/112; B29C 64/188; B29C 2071/0045; B33Y 10/00;
(Continued)

(56) References Cited

U.S. PATENT DOCUMENTS 6,508,979 B1 *  1/2003  Requicha .............. B82Y 40/00
                                                   419/7
2003/0162004 A1  8/2003  Mirkin et al.
(Continued)

FOREIGN PATENT DOCUMENTS

WO      2007063695 A1    6/2007

*Primary Examiner* — Leo B Tentoni
(74) *Attorney, Agent, or Firm* — Park, Vaughan, Fleming & Dowler LLP

(57) ABSTRACT

The disclosed embodiments provide a system that forms a three-dimensional (3D) nanostructure through 3D printing. During operation, the system performs a 3D printing operation that uses multiple passes of a scanning probe microscope (SPM) tip to deliver an ink to form the 3D nanostructure, wherein the ink includes both a positively charged polyelectrolyte (PE) and a negatively charged PE. While delivering the ink, the SPM tip is loaded with the ink and moved to a target location to deposit the ink. Finally, after the multiple passes are complete, the system cures the 3D nanostructure to remove excess positive or negative charges from the 3D nanostructure.

15 Claims, 9 Drawing Sheets

(51) Int. Cl.
| | |
|---|---|
| B33Y 70/00 | (2020.01) |
| B33Y 10/00 | (2015.01) |
| B33Y 30/00 | (2015.01) |
| B29C 67/00 | (2017.01) |
| B33Y 80/00 | (2015.01) |
| G03F 7/00 | (2006.01) |
| C09D 11/10 | (2014.01) |
| B29C 64/188 | (2017.01) |
| B29C 64/393 | (2017.01) |
| B29C 64/35 | (2017.01) |
| B82B 3/00 | (2006.01) |
| G01Q 80/00 | (2010.01) |
| B29C 71/00 | (2006.01) |
| B33Y 40/00 | (2020.01) |
| B33Y 50/02 | (2015.01) |
| B82Y 40/00 | (2011.01) |
| C09D 11/106 | (2014.01) |
| C09D 11/38 | (2014.01) |

(52) U.S. Cl.
CPC ............ *B29C 64/393* (2017.08); *B29C 67/00* (2013.01); *B33Y 10/00* (2014.12); *B33Y 30/00* (2014.12); *B33Y 70/00* (2014.12); *B33Y 80/00* (2014.12); *B82B 3/0004* (2013.01); *B82B 3/0095* (2013.01); *C09D 11/10* (2013.01); *G03F 7/0002* (2013.01); *B29C 2071/0045* (2013.01); *B33Y 40/00* (2014.12); *B33Y 50/02* (2014.12); *B82Y 40/00* (2013.01); *C09D 11/106* (2013.01); *C09D 11/38* (2013.01); *G01Q 80/00* (2013.01)

(58) Field of Classification Search
CPC ....... B33Y 40/20; B82B 3/0095; B82Y 40/00; G01Q 80/00
USPC .......................................... 264/233, 236, 308
See application file for complete search history.

(56) References Cited

U.S. PATENT DOCUMENTS

| | | |
|---|---|---|
| 2004/0008330 A1 | 1/2004 | Mirkin et al. |
| 2004/0175631 A1 | 9/2004 | Crocker et al. |
| 2012/0164396 A1 | 6/2012 | Mirkin et al. |

* cited by examiner

TECHNIQUE FOR THREE-DIMENSIONAL NANOPRINTING

GOVERNMENT LICENSE RIGHTS

This invention was made with U.S. government support under grant no. CHE1413708 awarded by the National Science Foundation. The U.S. government has certain rights in the invention.

FIELD

The disclosed embodiments generally relate to techniques for three-dimensional (3D) printing, nanotechnology and additive manufacturing. More specifically, the disclosed embodiments relate to a new technique for 3D nanoprinting, which uses a scanning probe microscope (SPM) tip to deliver a designed material in a designated pattern to produce 3D structures with nanometer precision.

RELATED ART

Three-dimensional (3D) printers use additive-manufacturing techniques to produce various 3D objects by custom-design with sizes ranging from micrometers to larger dimensions. In recent years, researchers have been attempting to miniaturize these 3D printing techniques to achieve a number of design goals, such as: improving the density of functional units; reducing material usage; and enabling advanced applications in electronics, optics and optoelectronic-devices, fluidics, sensors, and tissue engineering. Further miniaturization of these 3D printing techniques into the nanoscale (referred to as "3D nanoprinting") is presently a frontier area of 3D printing research, which is motivated by the desire for further improvements in density, speed and performance for devices produced through 3D printing.

3D nanoprinting also makes it possible to exploit unique properties that only 3D nanomaterials can provide. This makes it possible to produce unique products, such as: electronic devices that make use of quantum-confinement effects; high-selectivity and high-specificity bioligand arrays for sensors and biochips; and high-efficacy scaffolds to facilitate regenerative medicine and tissue engineering.

Various techniques have been developed to miniaturize 3D printing, including: (1) direct deposition of small amounts of fluidic materials using a micro-syringe; and (2) laser-directed photopolymerization. Unfortunately, these techniques have limitations. Micro-syringes can reach sub-micron resolution, down to hundreds of nanometers. However, further miniaturization is difficult due to the challenges related to precisely delivering minute amounts of materials. The theoretical spatial resolution of typical laser-induced polymerization is the diffraction limit of the laser light, which is half of the laser's wavelength (e.g., 500 nm/2=250 nm). Some researchers have reported fabricating 9 nm features by using sub-diffraction optical beam lithography. However, they can only print using a limited set of photopolymerizable materials. Hence, neither of these techniques can be used as a generic 3D nanoprinting technology.

What is needed is a technique for 3D nanoprinting, which does not suffer from the above-described drawbacks of existing techniques.

SUMMARY

The disclosed embodiments provide a system that forms a three-dimensional (3D) nanostructure through 3D printing. During operation, the system performs a 3D printing operation that uses multiple passes of a scanning probe microscope (SPM) tip to deliver an ink to form the 3D nanostructure, wherein the ink includes both a positively charged polyelectrolyte (PE) and a negatively charged PE. While delivering the ink, the SPM tip is loaded with the ink and moved to a target location to deposit the ink. Finally, after the multiple passes are complete, the system cures the 3D nanostructure to remove excess positive or negative charges from the 3D nanostructure.

In some embodiments, loading the SPM tip with the ink involves loading a single ink containing both positively charged and negatively charged PEs onto the SPM tip.

In some embodiments, loading the SPM tip with the ink involves loading a first ink containing a positively or negatively charged PE onto the SPM tip, and then loading a second ink containing an oppositely charged PE on the same SPM tip.

In some embodiments, the ink is delivered layer-by-layer to form the 3D nanostructure, wherein each layer is two-dimensional (2D) and comprises one or more of the following: a plurality of dots; a plurality of lines; and a plurality of 2D geometries.

In some embodiments, the ink is delivered line-by-line to form the 3D nanostructure.

In some embodiments, curing the 3D nanostructure involves washing the 3D nanostructure with one or more of the following: water; methanol; ethanol; acetone; isopropanol; n-propanol; butanol; tetrahydrofuran; dimethylformamide; acetonitrile; ether; 1,4-dioxane; chloroform; diethyl ether; ethyl acetate; dimethyl sulfoxide; acetic acid; formic acid; and ammonium hydroxide.

In some embodiments, curing the 3D nanostructure involves aging the 3D nanostructure in air.

In some embodiments, the ink comprises: a positively charged PE; a negatively charged PE; a salt; and a solvent.

In some embodiments, the salt comprises ions selected from: a group of positive ions comprising $Li^+$, $Na^+$, $K^+$, $Ca^{2+}$, $Mg^{2+}$, $Fe^{2+}$, $Fe^{3+}$, $Cu^{2+}$, $Zn^{2+}$, $Ag^+$, $Ba^{2+}$; and a group of negative ions comprising $F^-$, $Cl^-$, $Br^-$, $I^-$, $CO_3^{2-}$, $ClO_4^-$, $PO_4^{3-}$, $NO_3^-$, $NO_2^-$, $S_2O_3^{2-}$, $SO_3^{2-}$, $SO_4^{2-}$.

In some embodiments, the positively charged PE is selected from a group comprising: poly(diallyldimethyl ammonium chloride), poly(allylamine) hydrochloride, poly(ethylenimine), poly(4-vinyl pyridine), polyaniline, polypyrrole, phenylbenzenamine, enzymes, basic polysaccharides, poly-(1,4) N-acetyl-D-glucosamine, cationic lipids, and polycarboxybetaine.

In some embodiments, the negatively charged PE is selected from a group comprising: poly(styrene sulfonate), poly(acrylic acid), sulfonated poly-p-phenylene azobenzene, acidic polysaccharides, polyuronides, alginic acid, carrageenans, hyaluronic acid, polylactic acid, polyglycolic acid, copolymers of organic acids.

In some embodiments, the ink includes a zwittorionic PE, which is selected from a group comprising: polynucleotides, peptides, proteins, peptide nucleic acids, enzymes, collagen, fibrin, proteoglycans.

In some embodiments, the ink includes a neutral PE, which is selected from a group comprising: polyacetylene, polythiophene, poly(3,4 ethylenedioxythiophene), poly(tetrafluoroethylene) carboxylate, poly(tetrafluoroethylene) phosphonate, polyphenylene vinylene, enzymes, polysaccharides, starch, cellulose, hemicelluloses, arabinoglucuronoxylan, galactans, agarose.

In some embodiments, after the 3D nanostructure is formed, the method further comprises performing an imaging operation to obtain an image of the 3D nanostructure.

In some embodiments, the technique utilizes a sharp apex of an SPM tip to deliver desired materials to defined locations. The locations are defined to follow a pre-designed geometrical path.

In some embodiments, this technique involves an apparatus that facilitates: ink formulation, ink loading onto the printing tip, delivery of ink to defined locations layer-by-layer, curing and characterization of the resulting 3D structures.

In a variation on these embodiments, the apparatus comprises a tip with an apex size of 1 nm to 500 nm; a substrate; 1-3 positioners with nanometer accuracy (0.02-100 nm) while controlling movement and position in all the dimensions; electronics to control the positioning and movement; software to enable layer-by-layer construction and deconstruction of a 3D geometry, as well as to control electronics for imaging the substrate and associated structures.

In a variation on these embodiments, the ink-loading process involves a controlled contact of the tip apex to a minute volume of premixed polyelectrolyte complexes (PECs) with designed compositions.

In a variation on these embodiments, the ink-loading process involves a controlled contact of the tip apex to a minute volume of individual PE components in a designed sequence.

In a variation on these embodiments, a surface that provides electrostatic attraction (or hydrogen bonding) to the ink is used as the substrate for printing.

In a variation on these embodiments, a 3D geometry is translated into scanning trajectory, which deposits material layer-by-layer, wherein each layer contains a slice of the geometry, and the stacking of the layers reconstructs the 3D geometry.

In a variation on these embodiments, the probe is brought in contact with the substrate at a designed location, force and dwelling time, which are controlled by the positioners and electronics. The location is controlled with nanometer accuracy, the force ranges from 0.01 nN to 50 μN, and the dwelling time ranges from 0.1 microsecond to 1.0 min.

In some embodiments, the ink materials are bound to the substrate by electrostatic attraction or hydrogen bonding, and the stack of 2D layers is bonded together by electrostatic attraction or hydrogen bonding.

In a variation on these embodiments, the ink is deposited by the tip with a lateral precision of 1.0 nm to 100 nm within each 2D layer, and with a vertical precision of 0.1 nm to 100 nm between layers.

In a variation on these embodiments, the cured 3D structure has a spatial precision of 0.1 nm in all three dimensions.

In some embodiments, this invention provides an ink formulation comprising: a positively charged (+) PE, a negatively charged (−) PE, salts, and a solvent. The molecular weight of the PE ranges from 0.1-100,000 kDa. The ratio (+) PE:(−) PE=0.001:1 to 1000:1. The concentration of the salt ranges from 0.1 mM to 10 M.

In other embodiments, this invention provides a technique for loading the material formulation onto the probe apex.

In a variation on these embodiments, the positively charged PE, the negatively charged PE, the salts, and solvent are premixed. The salt concentration is preferably in the range of 0.1 M to 3 M, which tunes the viscosity and electrostatic interaction within the ink but does not dissolve the PECs. The viscosity of the premixed ink is preferably in the range from 0.001 Pa·s to 1000 Pa·s, which facilitates loading the tip with the ink.

In some embodiments, the system uses material-loading protocols involving a controlled contact of the tip apex to a minute volume of the material of the formulation.

In some embodiments, the system uses material delivery protocols that follow a pre-designed geometry, layer-by-layer with nanometer precision in all three dimensions.

In some embodiments, the material delivery protocols ensure that the materials are transferred following the scanning trajectory of the apex, layer-by-layer with nanometer precision in all three dimensions.

In some embodiments, the system uses material curing protocols after the delivery process to maintain integrity of the 3D nanostructures.

In some embodiments, the system uses material imaging protocols to enable imaging and displaying the 3D structures.

In some embodiments, the sharp tip can include: an SPM probe with a sharp solid apex, an SPM probe with a hollow apex, or a sharp object with a sharp solid apex.

In some embodiments, the system includes electronics to control the positioning, movement and imaging, and a computer with software to control the electronics and to acquire and display images of the finished nanostructure.

In some embodiments, the material formulations are doped with nanoscale objects driven by electrostatic attraction, hydrogen bonding, and/or van der Waals forces from the group comprising: charged nanoparticles, drug molecules, DNAs, proteins, and dyes.

In some embodiments, the SPM is implemented as: an AFM, a near-field scanning optical microscope (NSOM); or a scanning tunneling microscope (STM).

In some embodiments, the apex comprises an array of sharp apexes.

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

Figure 1:
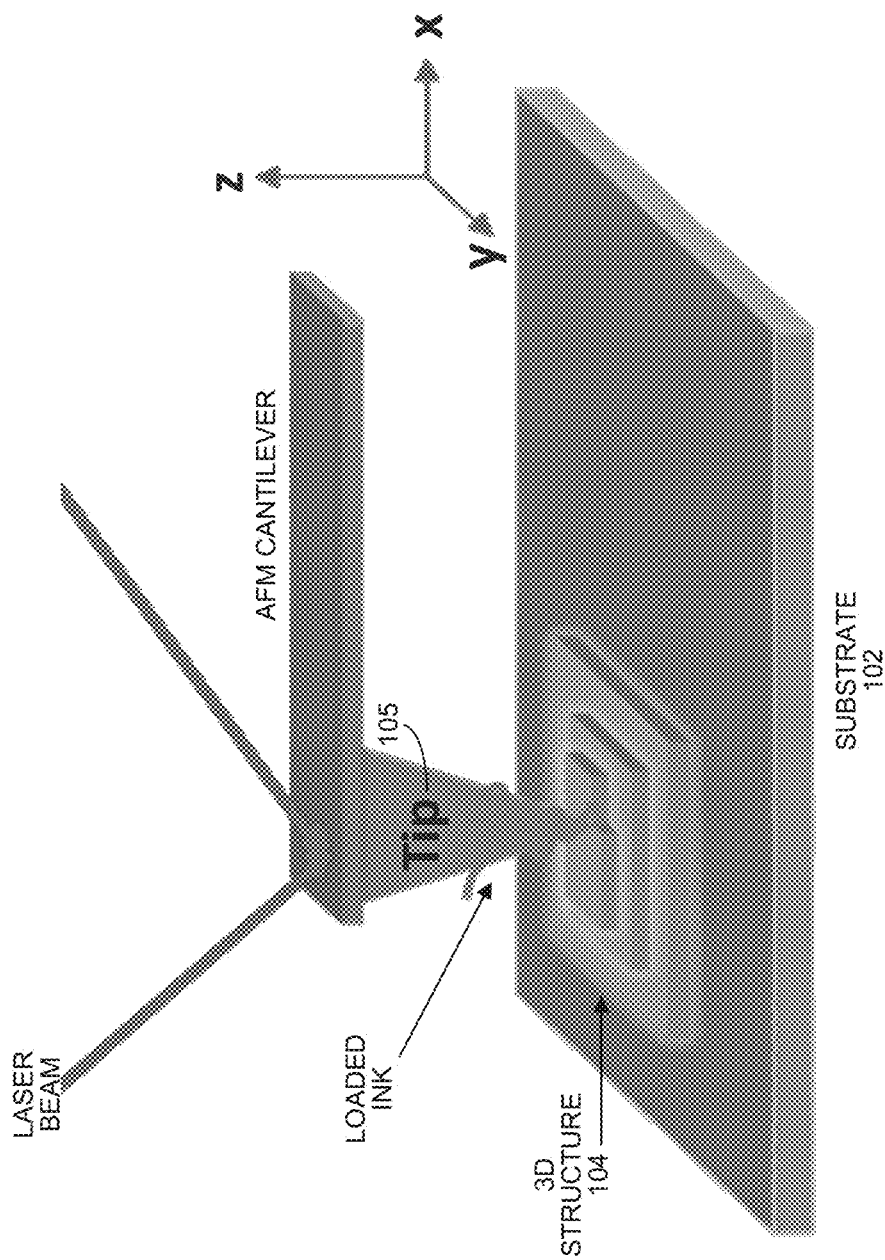
FIG. 1 illustrates 3D nanoprinting via tip-directed layer-by-layer deposition of ink materials in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

General Approach

In principle, 3D nanoprinting should fulfill the following technical requirements: (1) genuine nanometer (preferably molecular level) precision in both positioning and material delivery; (2) accommodation of a wide range of functional materials; (3) 3D custom-design support; and (4) ease of use with practical throughput.

Our methodology for performing 3D nanoprinting is based on scanning probe microscopy (SPM), which can include atomic force microscopy (AFM), and scanning tunneling microscopy (STM). SPM is known for its high spatial accuracy in movement, imaging and 2D nanolithography. (See U.S. Pat. No. 7,102,656, entitled "Electrostatically Driven Lithography" by inventors Chad A. Mirkin, et al., issued 5 Sep. 2006, and U.S. Pat. No. 5,922,214, entitled "Nanometer Scale Fabrication Method to Produce Thin Film Nanostructures" by inventors Gang-Yu Liu, et al., issued 13 Jul. 1999.)

The feasibility of using an SPM as a 3D printer has been demonstrated to a preliminary degree via anecdotal experiments: (1) a technique that uses stationary contact between an atomic force microscopy (AFM) tip and a substrate has produced a "3-layered nanocake." (see Radha, B.; Liu, G. L.; Eichelsdoerfer, D. J.; Kulkarni, G. U.; Mirkin, C. A., Layer-by-Layer Assembly of a Metallomesogen by Dip-Pen Nanolithography. *ACS Nano* 2013, 7 (3), 2602-2609); (2) AFM-based sculpting via thermal decomposition was used to produce a nanoscale replica of a mountain (see Pires, D.; Hedrick, J. L.; De Silva, A.; Frommer, J.; Gotsmann, B.; Wolf, H.; Despont, M.; Duerig, U.; Knoll, A. W., Nanoscale Three-Dimensional Patterning of Molecular Resists by Scanning Probes. *Science* 2010, 328 (5979), 732-735); and (3) a technique that uses 2D nanolithography in conjunction with pattern transfer was used to build up a nanostructure (see Lee, S. W.; Sanedrin, R. G.; Oh, B. K.; Mirkin, C. A., Nanostructured Polyelectrolyte Multilayer Organic Thin Films Generated via Parallel Dip-Pen Nanolithography. *Adv. Mater.* 2005, 17 (22), 2749-2753). However, there presently exists a large technical gap between these experimental results and the ultimate goal of achieving genuine layer-by-layer 3D nanoprinting by design.

A number of technical challenges still need to be addressed before we reach this goal, including: (1) performing material delivery in minute amounts to designated locations; (2) attaining nanometer precision in all three dimensions and nanometer spatial registry between layers; (3) accommodating a wide range of functional materials.

A 3D printing system that effectively addresses these challenges is described in detail below.

Technical Details

The present invention provides a technique for layer-by-layer fabrication of 3D nanostructures using tip-directed delivery of ink of PECs. Refer to FIG. 1, which illustrates how an AFM tip 105 can be used to construct a 3D structure 104 on a substrate 102. The resulting 3D nanostructures have nanoscale features, and are amenable to fabrication with biocompatible materials.

This technique uses: an SPM tip with an apex size of 1 nm to 100 nm, and a positioner with precision of 0.1 nm to 100 nm in 3D movement. Moreover, the tip can be a non-hollow tip, or a hollow tip with an internal channel. Also, arrays of non-hollow or hollow tips may be used for parallel printing.

A first ink formulation, which is referred to as "Ink I," comprises a premixed formulation, which includes: a positively charged PE, a negatively charged PE, a salt, and a solvent. Note that the oppositely charged PEs form PECs in the solvent. The salt is added to tune the viscosity and electrostatic interaction within the PECs. The molecular weight of the PE is preferably high enough to form PECs (e.g., at least 1 kDa), but low enough to form a concentrated ink with a viscosity that facilitates the loading of ink containing PECs onto the tip (preferably at most 1000 kDa). The charge ratio (negative charge/positive charge) between the positively charged and negatively charged PEs is preferably in the range from 1:10 to 10:1, which facilitates the formation of PECs. The concentration of each PE is preferably in the range from 0.001 M to 1.0 M, and even more preferably in the range from 0.01 M to 0.1 M. KBr is preferably used as salt for the ink formulation, although other salts that interact with the PECs through electrostatic interactions can be used, such as NaCl and KCl. The salt concentration is preferably in the range from 0.1 M to 3.0 M, which tunes the viscosity and electrostatic interaction in the ink but does not dissolve the PECs. The viscosity of the premixed ink is preferably in the range from 0.001 Pas to 1000.0 Pas, which facilitates loading the ink onto the tip. Water can be used as solvent. However, other solvents that dissolve PEs, such as water, methanol, ethanol, isopropanol, n-propanol, butanol, acetone, tetrahydrofuran, dimethylformamide, acetonitrile, ether, 1,4-dioxane, chloroform, diethyl ether, ethyl acetate, dimethyl sulfoxide, acetic acid, formic acid, or mixture of the above may be used.

Figure 2A:
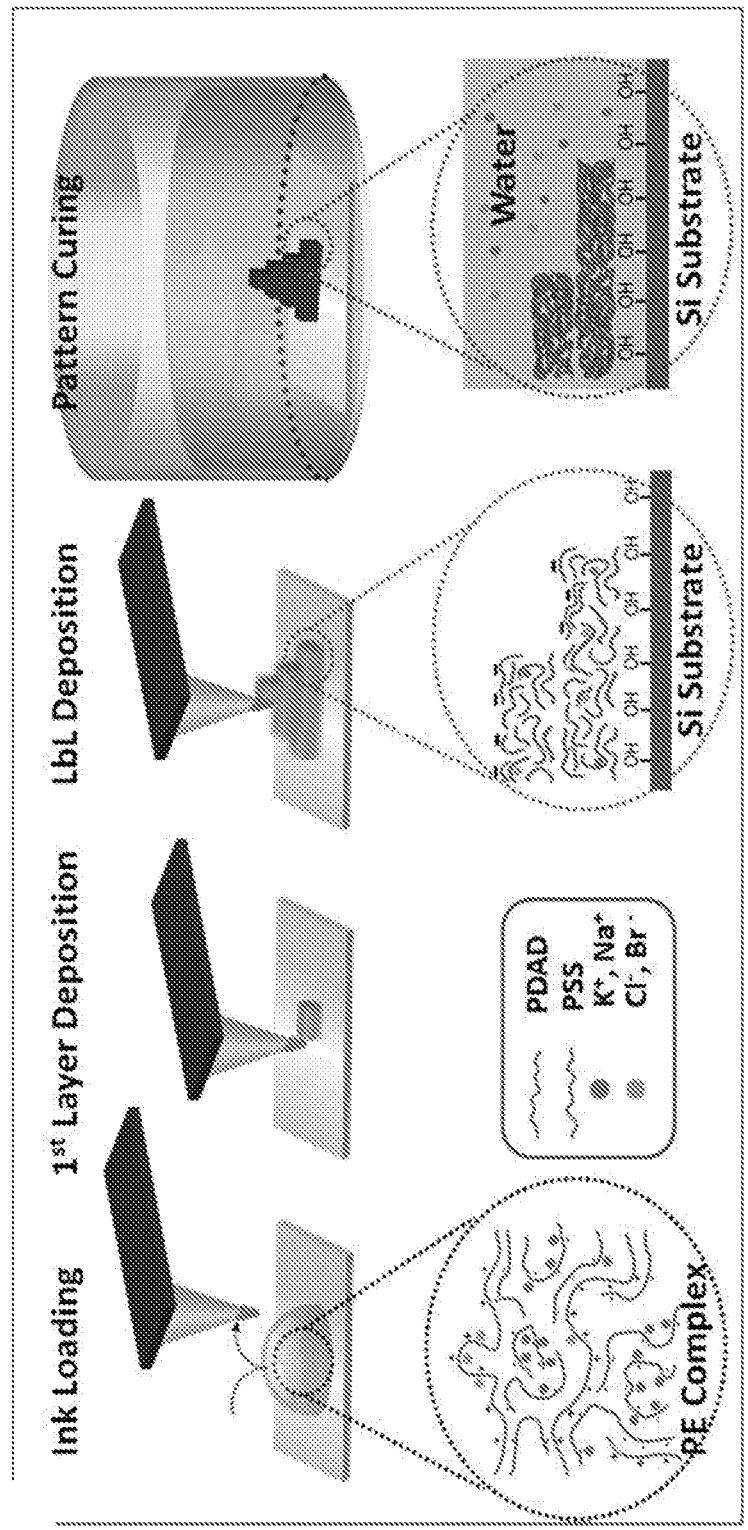
FIG. 2A illustrates various steps in the 3D nanoprinting process in accordance with the disclosed embodiments.

Note the formulation of Ink I is different from the ink described in U.S. Pat. No. 7,790,061, which only comprises oppositely charged PEs and solvent without salt. The loading of Ink I onto the AFM tip is illustrated in FIG. 2A. Note the tip dipped into a droplet of Ink I to load the premixed PEC ink onto the tip.

Figure 5A:
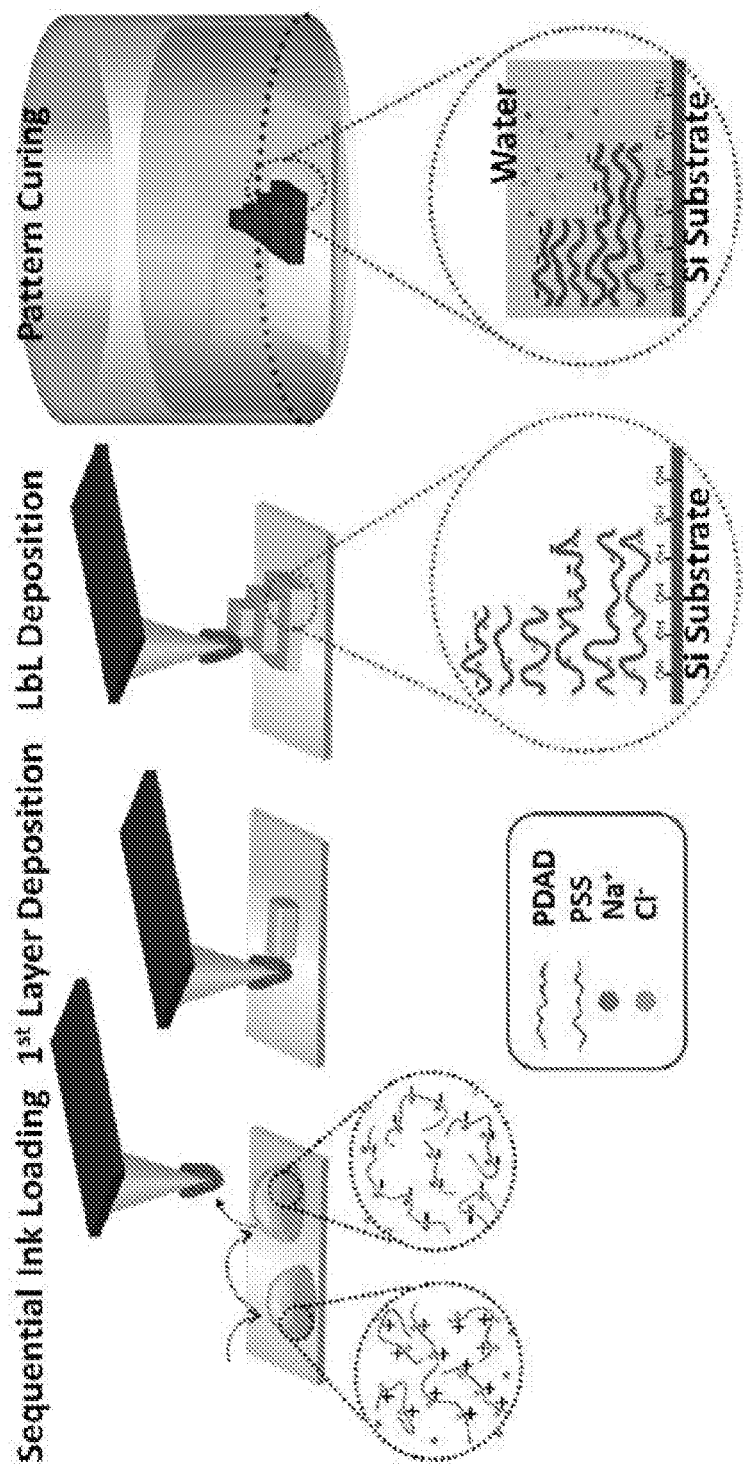
FIG. 5A illustrates a number of steps for layer-by-layer 3D nanoprinting with sequential loading of PDAD and PSS onto an AFM probe prior to printing in accordance with the disclosed embodiments.

A second ink formulation, which is referred to as "Ink II," is formed through sequential loading of a positively charged PE and a negatively charged PE as shown in FIG. 5A. This technique leads to in-situ formation of PECs on the AFM tip. The positively charged PE is preferably loaded to the tip first, followed by the loading of the negatively charged PE. The molecular weight of the PE is preferably high enough to form PECs (preferably at least 1 kDa), but low enough to form a concentrated ink with a viscosity that facilitates loading the ink containing PECs onto the tip (preferably at most 1000 kDa). The charge ratio (negative charge/positive charge) between the positively charged and negatively charged PEs is preferably in the range from 1:10 to 10:1, which facilitates the formation of PECs. The concentration of each PE solution is preferably in the range from 0.001 M to 1.0 M, and even more preferably in the range from 0.01 M to 0.1 M. The viscosity of each PE solution is preferably in the range from 0.001 Pa·s to 1000 Pa·s, which facilitates loading the ink onto the tip. Water is preferably used as the solvent, although other solvents that dissolve PEs can be used, such as ethanol and acetone.

The PEs can be synthetic or natural polymers which are positively charged, negatively charged, zwitterionic, or neutral. The positively charged PE is selected from a group comprising: poly(diallyldimethyl ammonium chloride), poly(allylamine) hydrochloride, poly(ethylenimine), poly(4-vinyl pyridine), polyaniline, polypyrrole, phenylbenzenamine, enzymes, basic polysaccharides, poly-(1,4) N-acetyl-D-glucosamine, cationic lipids, and polycarboxybetaine. The negatively charged PE is selected from a group comprising: poly(styrene sulfonate), poly(acrylic acid), sulfonated poly-p-phenylene azobenzene, acidic polysaccharides, polyuronides, alginic acid, carrageenans, hyaluronic acid, polylactic acid, polyglycolic acid, copolymers of organic acids. The zwitterionic PE is selected from a group comprising: polynucleotides, peptides, proteins, peptide nucleic acids, enzymes, collagen, fibrin, proteoglycans. The neutral PE is selected from a group comprising: polyacetylene, polythiophene, poly(3,4 ethylenedioxythiophene), poly(tetrafluoroethylene) carboxylate, poly(tetrafluoroethylene) phosphonate, polyphenylene vinylene, enzymes, polysaccharides, starch, cellulose, hemicelluloses, arabinoglucuronoxylan, galactans, agarose.

carrying positive or negative charges. Examples of PEs that may be used for ink formulation include: poly(styrene sulfonate), poly(diallyldimethyl ammonium chloride), poly(acrylic acid), poly(ethylenimine), poly(4-vinyl pyridine), cationic or anionic surfactants. They also include biological PEs, such as DNAs, RNAs, peptides, proteins, enzymes, and polysaccharides. FDA-approved biodegradable polymers may also be used as ink materials, such as negatively charged poly(L-lactic acid) and poly(L-glycolic acid). Note that the 3D nanostructures constructed with biological PEs may be used as tissue engineering scaffolds for cell growth. Nanoscale objects that interact with PEs through hydrogen bonding or electrostatic attraction, such as nanoparticles, drug molecules, DNAs, proteins, and dyes may also be incorporated into the inks in amounts that do not affect the formation of PECs.

The surface of the substrate is preferably capable of interacting with PEC materials through electrostatic attraction or hydrogen bonding. Note that the substrate and its surface are not particularly limited. They can be homogeneous or heterogeneous, planar or uneven, multi-layered or single-layered.

The positioning and movement of the inked tip can be controlled by a piezoelectric positioner through a program. For example, an AFM tip can be controlled by Asylum Research's (an Oxford Instrument Company) software running on the Igor platform.

3D nanoprinting is performed by delivering ink to the substrate from the tip as is shown in FIGS. 2A and 5A. The delivery is controlled by the force applied to the tip against the substrate, wherein the force can be in the range from 0.1 nN to 50 µN. The delivery may be driven by electrostatic attraction between the ink and substrate. However, the present invention is not limited to any particular type of drive force, as long as the controlled delivery can be accomplished, and the ink materials can be printed layer-by-layer onto the substrate.

The printed 3D nanostructure can be constructed by stacking of 2D layers, wherein each 2D layer comprises a plurality of dots, a plurality of lines, or combinations of dots and lines. The ink materials are bound to the substrate by electrostatic attraction or hydrogen bonding. Similarly, the stacking of 2D layers is driven by electrostatic attraction or hydrogen bonding among the layers. The ink can be deposited by the tip with a lateral precision from 1 nm to 100 nm within each 2D layer, and a vertical precision from 0.1 nm to 100 nm between 2D layers.

After the printing process completes, the 3D nanostructure can be cured in a solvent, such as water. This curing process removes excessive positive or negative charges within the nanostructure, thereby strengthening the electrostatic attraction within the structure, which leads to further solidification. Curing can also be performed through mechanisms that strengthen the electrostatic attraction within the nanostructure, such as pH changes, ionic strength changes, solvent composition changes, or combinations of more than one of these changes. The cured 3D nanostructure can have a lateral resolution of 1 nm to 100 nm, and a vertical resolution of 0.1 nm to 100 nm.

Note that the cured 3D structure can be imaged by the same apparatus used for printing. In this way, the apparatus that is used for 3D nanoprinting, preferably an AFM, can also be used to immediately characterize the structure with molecular resolution.

Note that the 3D nanostructures fabricated by this technique are highly stable in different environments. For example, immersion in water for two weeks, storing in a dust-free container for one month, or overnight baking at 200° C., causes little deformation in these 3D nano structures.

This invention has several advantages over previous 3D nanofabrication technologies. In particular, this invention facilitates: (1) production of 3D nanostructures by custom design; (2) production of 3D structures with nanoscale features; (3) 3D printing with nanometer accuracy and precision in all three dimensions; (4) incorporation of a wide range of functional materials into the 3D nanostructures for designed applications; and (5) high-throughput fabrication of 3D nanostructures using arrays of printing tips.

Also, this invention can potentially be used for fabrication of a wide range of functional 3D structures where the active structural units are at nanometer scale. These functional 3D structures include: nanoelectronics and photonic devices; quantum computing devices; new materials for controlling cellular function; and structures to facilitate stem cell-based regenerative medicine and therapy, tissue engineering, and artificial organs.

EXAMPLES

The following examples are provided to more fully illustrate the present invention.

Line-by-Line 3D Nanoprinting

A well-known difficulty in using an SPM to perform 3D nanoprinting is achieving precise vertical stacking of multiple passes along the surface normal, wherein nanoregistry takes place during each pass. The difficulty is caused mainly by drift in the probe's position over time. To cope with this problem, materials can be deposited line-by-line, instead of layer-by-layer, to reduce the time interval involved in the deposition process, and thus the drift. In addition, PEC formulation, loading and deposition conditions can be carefully selected to enable the line-by-line deposition with nanometer accuracy.

The effectiveness of line-by-line 3D nanoprinting has been demonstrated empirically. More specifically, as shown in FIG. 2A, a PEC, defined as Ink I, was formulated by premixing 0.5 M poly(styrene sulfonate) (PSS, Mw 75 kDa), 0.5 M poly(diallyldimethyl ammonium chloride) (PDAD, Mw 450 kDa), and 1.8 M KBr in water. Ink I exhibits high viscosity, which minimizes smearing during deposition. Moreover, the addition of KBr can enhance homogeneity.

Figure 2B:
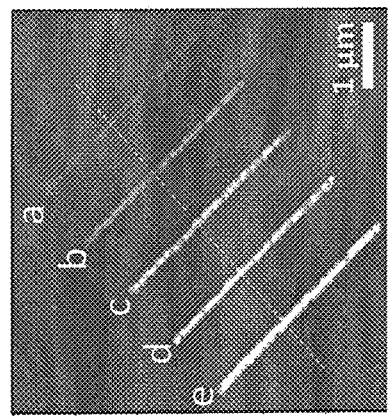
FIG. 2B illustrates an AFM topographic image of a 3D nanoline array produced through 3D nanoprinting in accordance with the disclosed embodiments.
Figure 2C:
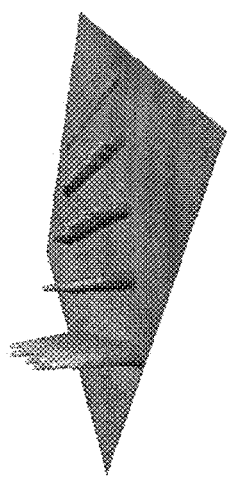
FIG. 2C presents a 3D view of the lines illustrated in FIG. 2B in accordance with the disclosed embodiments.

During the nanoprinting process an "inkwell" containing a 20 μl droplet of Ink I was deposited on a clean Si(111) surface. To load the ink on the AFM tip, the AFM tip (AC-240, Olympus, spring constant 1.7 N/m) was brought into contact with the edge of the droplet at a 20 nN load for 10 s. Next, the tip was lifted and moved to a designated location far from the inkwell, where during a first pass, a 3 μm line was completed at 20 nN and 1 μm/s. The tip was then stopped, kept under the same load, and was then allowed to reverse direction, scanning a second pass backward along the same linear trajectory with identical force and speed. Note that the tallest line illustrated in FIGS. 2B-D marked as "e" took 256 passes to complete. Lines a, b, c, d and e were printed using incremental numbers of passes: 10, 32, 64, 128, and 256, respectively, and the printing was performed with an AFM load of 20 nN at 1 μm/s. Note that material delivery is driven by electrostatic attraction between the ink and the $SiO_2$ surface during the first pass, and then by attraction and adhesion between PE complexes during the second and subsequent passes.

The printed 3D structures were then cured by immersion in water to extract salt ions, such as $K^+$ and $Br^-$, from the initial formulation. Note that this curing step strengthens the electrostatic attraction between PSS and PDAD, which stabilizes the structure for subsequent AFM characterization, as is shown in FIG. 2A. The salt-free complexes have a modulus of at least 10 MPa, even when wet, when measured independently as a 300 nm thick thin film or 1 mm diameter PSS/PDAD rods. Prior to imaging, the AFM probes were pre-coated with octadecyltrichlorosilane (OTS) self-assembled monolayers to minimize adhesion for high resolution structural characterization.

Figure 2D:
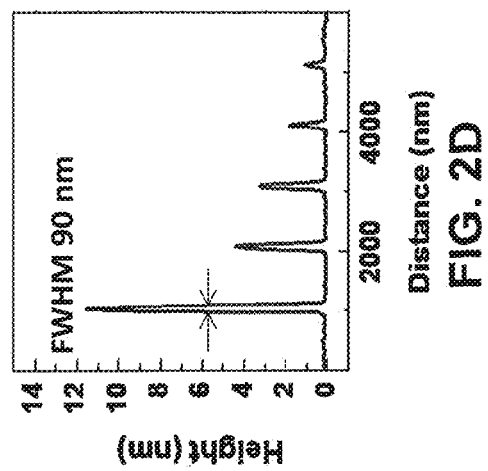
FIG. 2D illustrates a corresponding cursor profile as indicated by dotted line in FIG. 2B in accordance with the disclosed embodiments.

Referring to FIG. 2D, the five lines produced through this process are parallel with each other. The line height increases with an increasing number of passes from 0.9 nm to 11.8 nm. The line widths, characterized by full width at half maximum (FWHM), measure 75 nm, 80 nm, 90 nm, 88 nm and 90 nm, respectively, which indicates minimal broadening and high inter-pass registry even at 256 passes. These empirical results demonstrate how SPM can be used to perform 3D nanoprinting for line-based structures.

Figure 3:
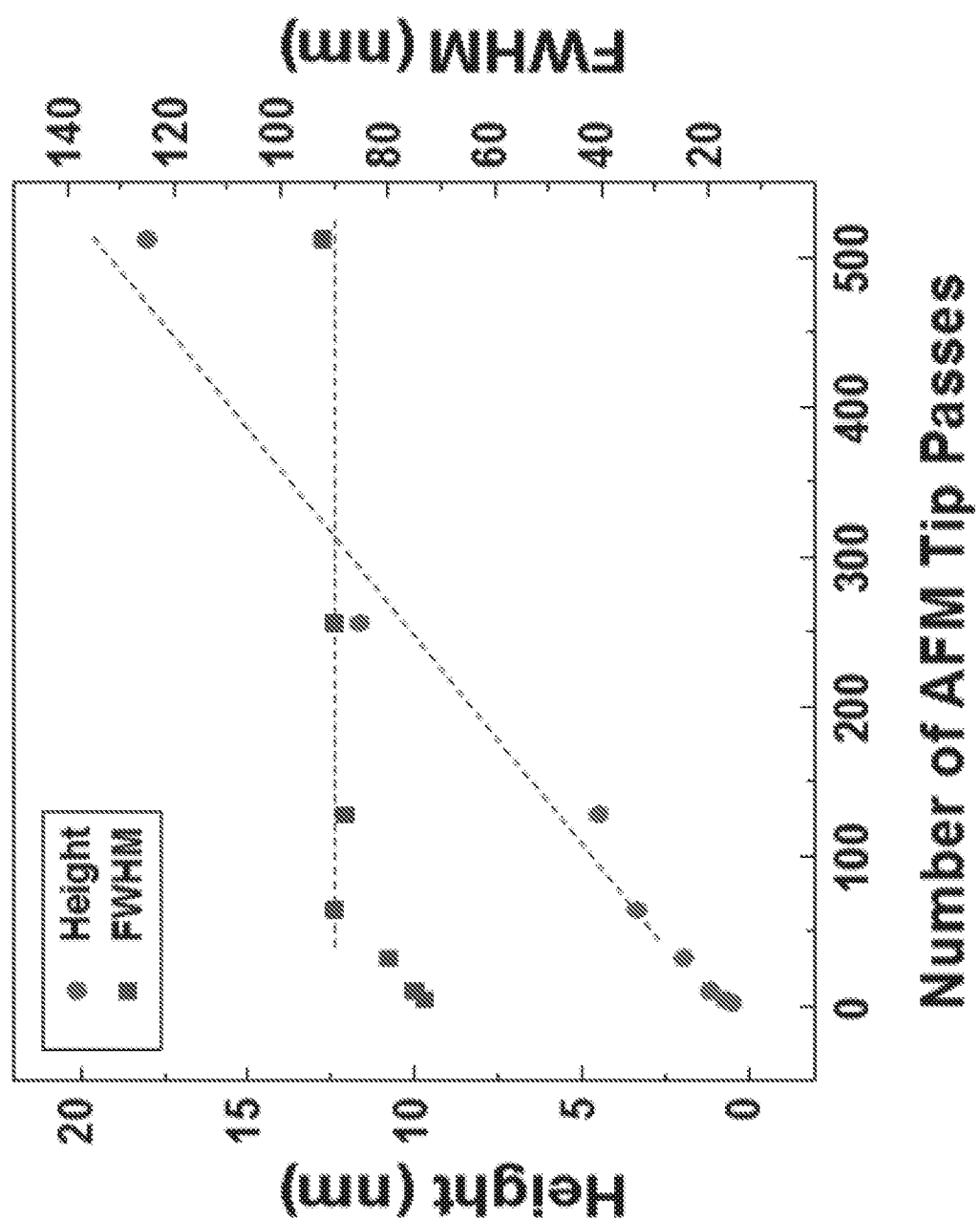
FIG. 3 shows plots of height (triangles) and fwhm (dots) of nanolines as a function of the number of passes in accordance with the disclosed embodiments.

The heights and FWHM of printed nanolines as a function of the number of printing passes are plotted in FIG. 3. The heights of the printed structures were obtained from the cursor profiles crossing the lines and surrounding areas, with the uncertainty representing the roughness atop the lines. Dashed and dotted lines provide guidelines to illustrate the trends. Note that printing with 512 passes results in a height of around 18 nm. Beyond 64 passes and up to 512 passes, the line width remains constant at 88±5 nm, further indicating high inter-pass registry. The "delivery efficiency" (defined as the height increase caused by each printing pass) is 0.035 nm/pass as measured from the slope of the dashed line representing height that appears in FIG. 3.

Line-Based 3D Nanostructures by Custom Design

Figure 4B:
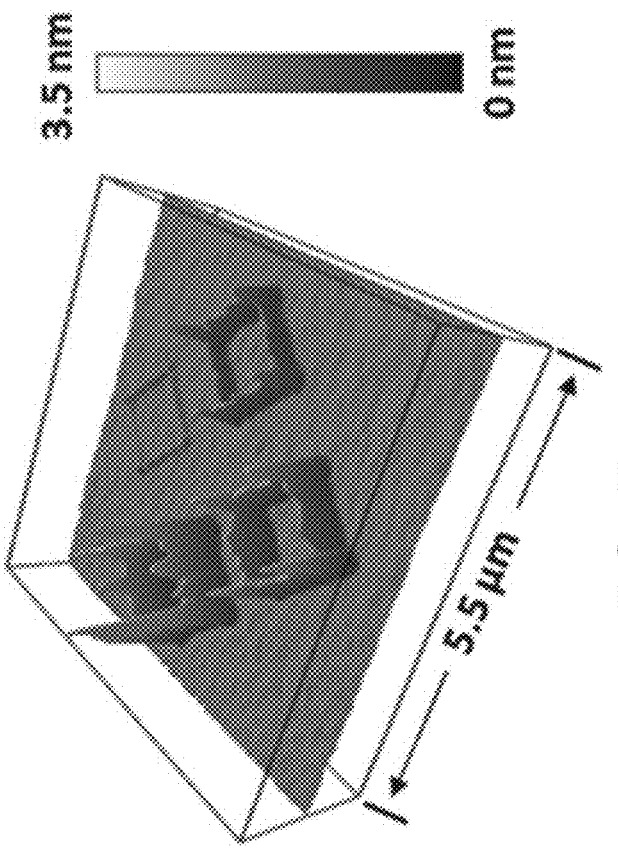
FIG. 4B presents a 3D view of the image in FIG. 4A in accordance with the disclosed embodiments.
Figure 4A:
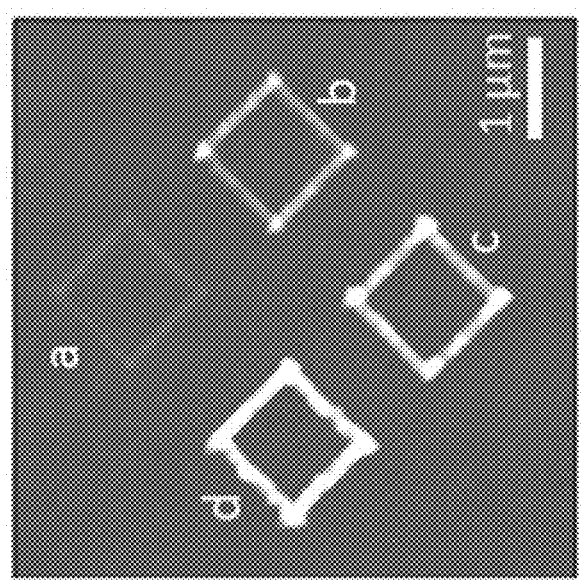
FIG. 4A presents an AFM topographic image of 4 "nanocastle turrets" produced by 3D nanoprinting in accordance with the disclosed embodiments.

The ability to print line-based 3D nanostructures by custom design is further demonstrated by production of four sets of nanocastle turrets at designated locations as shown in FIGS. 4A and 4B. These nanocastle turrets were printed using the same ink formulation, loading, deposition and imaging protocols as are shown in FIG. 2A. For each turret, four nanoparapets sit at four corners of perpendicularly crossing walls. The walls of a, b, c, and d were printed line-by-line with 4, 40, 80 and 128 passes, respectively. During this process, a force of 20 nN and a scanning speed of 1 μm/s were used. Note that the walls in structure "a" measure 0.3 nm in height and 88 nm in width, while the parapets at all four corners measure 0.3 nm in height above the wall and 85 nm in width. As each parapet was formed at the intersection of two walls, the height of the parapet above the wall was controlled to substantially equal the height of the wall. For structure "d," the parapets measure 2.5 nm in height above the wall and 140 nm in width, and the walls below measure similarly to the parapets, 2.2 nm in height and 145 nm in width.

Layer-by-Layer 3D Nanoprinting by Custom Design

To perform layer-by-layer 3D nanoprinting, the ink-loading process was changed into a 2-step process as illustrated in FIG. 5A. Referring to FIG. 5A, an AFM tip is first dipped into a droplet of 0.1 M PDAD (450 kDa) aqueous solution, and is then lifted and dipped into a droplet of 0.1 M PSS (75 kDa) aqueous solution. The materials at the AFM probe apex, loaded by this sequential loading process, are referred to as Ink II. In a sense, this process creates a "non-equilibrium" toner because the individual PE components were not pre-mixed homogeneously before loading them onto the tip and delivering them to the surfaces.

Figure 5D:
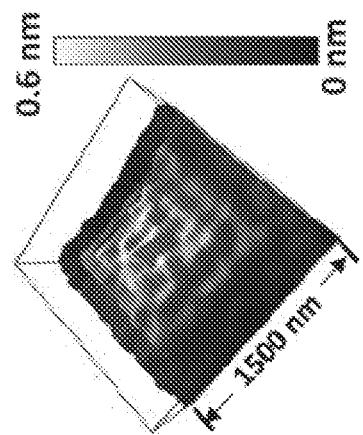
FIG. 5D presents a 3D view of an AFM image of a nanosquare pyramid produced by layer-by-layer printing of 3 layers using Ink III in accordance with the disclosed embodiments.
Figure 5C:
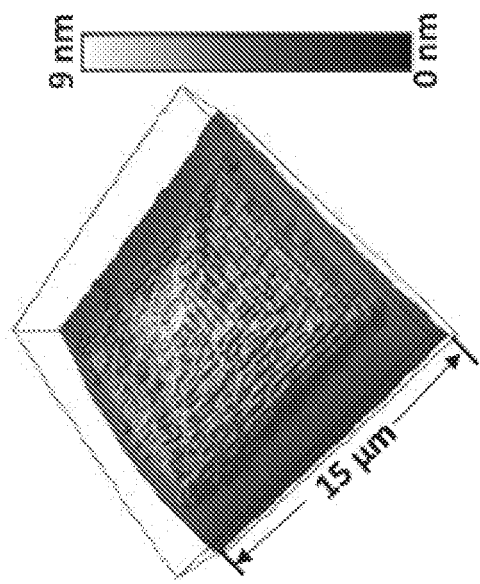
FIG. 5C presents a 3D view of the image illustrated in FIG. 5B in accordance with the disclosed embodiments.
Figure 5B:
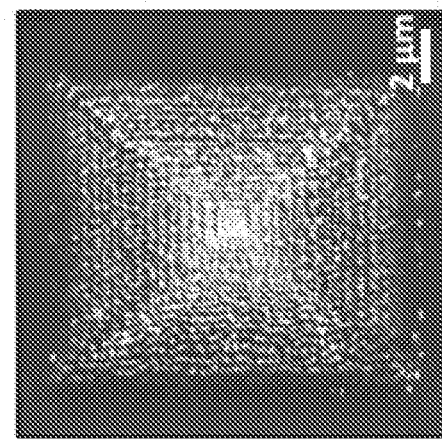
FIG. 5B presents an AFM topographic image of a square pyramid produced by layer-by-layer nanoprinting of 15 layers, each layer clearly visible in accordance with the disclosed embodiments.

FIG. 5B depicts a square pyramid constructed layer-by-layer in 15 layers using Ink II loaded only once onto the tip in the manner described above. The entire structure was printed in 20 min at a force of 20 nN, with each layer taking less than 2 min.

Each layer was designed as a 2D square. The smallest square of 500 nm×500 nm was printed first at 1 µm/s and 64 lines per frame. Then, a concentric square sized 1250 nm×1250 nm was printed to cover the first square. The above operation was iterated 15 times, each time at a greater square size, to build the square pyramid. 64 lines-per-frame was used for the $1^{st}$ through the $7^{th}$ iterations, and 128 lines-per-frame was used for the $8^{th}$ through the $15^{th}$ iterations. In the final product illustrated in FIGS. 5B-5D, the last and widest deposited layer measures 11.5 µm×11.5 µm, and the topmost layer measures 500 nm×500 nm. The spatial accuracy is demonstrated by the near-perfect square geometry and the precise nanometer inter-layer registry among all 15 layers. Note that the height of each layer is 0.4 nm, which is much taller than the 0.035 nm/pass of the previous example illustrated in FIG. 3, which indicates at least a 10-fold improvement in delivery efficiency. The higher delivery efficiency can be rationalized by the packing of ink materials at the apex of the AFM probe, as well as by the ink-surface interactions. Unlike Ink I or conventional PE systems that contain equal cationic and anionic components (PSS:PDAD=1:1) and form densely packed PECs, Ink II does not follow the 1:1 stoichiometry due to different pick-up efficiencies in sequential loading. There is likely more PSS than PDAD, because the PSS was loaded atop the PDAD inked tip apex, i.e., facing larger surface area under the same loading force. (Note that non-equal components in PE mixtures typically lead to a less viscous liquid than 1:1 mixing.) In addition, the packing among positive and negative components is less dense due to the excess amount of PSS. As such, the PSS tends to favor separation to reach force balance, which facilitates delivery. This could explain the higher delivery efficiency of Ink II in comparison to Ink I.

Note that the 3D nano-pyramid illustrated in FIGS. 5B-D exhibited high stability. Immersion in water for two weeks showed little deformation or swelling. Storing in a dust-free sealed container for one month, followed by overnight baking at 200° C., did not result in significant morphological changes.

Along with demonstrating true 3D nanoprinting in the experiments associated with FIG. 5B, we also tested the smoothness within each layer as a function of ink formulation. For example, the layers in FIG. 5B exhibit granular features with grains sized at 0.2-0.5 nm. The roughness can be reduced by using PE components with lower molecular weight, i.e., smaller molecules. As shown in FIG. 5D, a 3-layer structure was constructed using Ink III, which was formed through sequential loading of 0.1 M PDAD (8.5 kDa) and 0.1 M PSS (75 kDa) aqueous solutions. In this case, the roughness of each layer was reduced to less than 0.2 nm. Note that the top layer measures 0.4 nm in height and 80 nm in lateral dimensions, revealing the capability of this invention to construct 3D objects of nanometer feature size in all three dimensions.

3D Printing Process

Figure 6A:
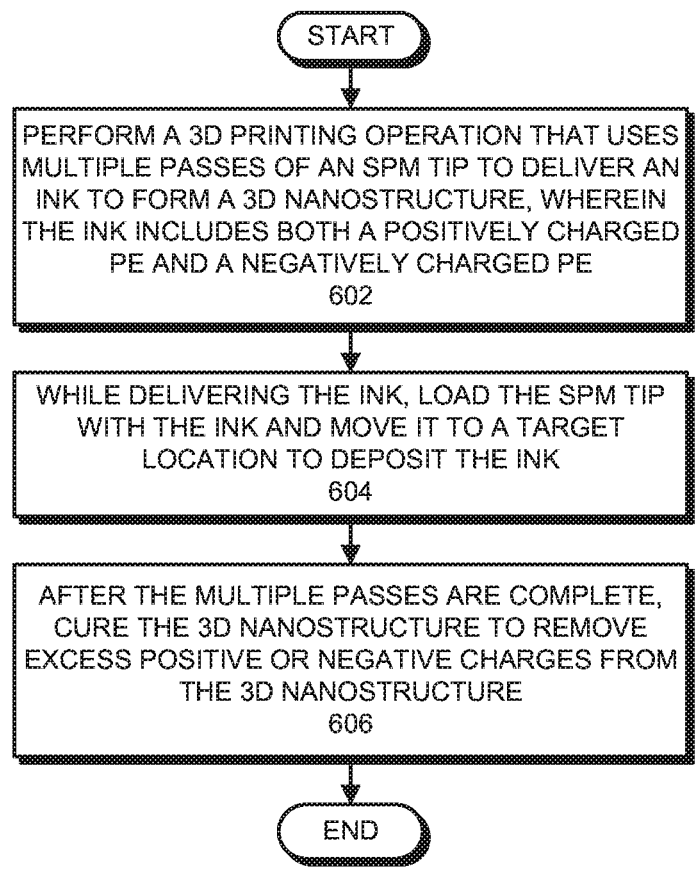
FIG. 6A presents a flow chart for a 3D nanoprinting process in accordance with the disclosed embodiments.

FIG. 6A presents a flow chart for the 3D nanoprinting process in accordance with the disclosed embodiments. During operation, the system performs a 3D printing operation that uses multiple passes of an SPM tip to deliver an ink to form the 3D nanostructure, wherein the ink includes both a positively charged polyelectrolyte (PE) and a negatively charged PE (step 602). While delivering the ink, the system loads the SPM tip with the ink and moves it to a target location to deposit the ink (step 604). Finally, after the multiple passes are complete, the system cures the 3D nanostructure to remove excess positive or negative charges from the 3D nanostructure (step 606).

Figure 6B:
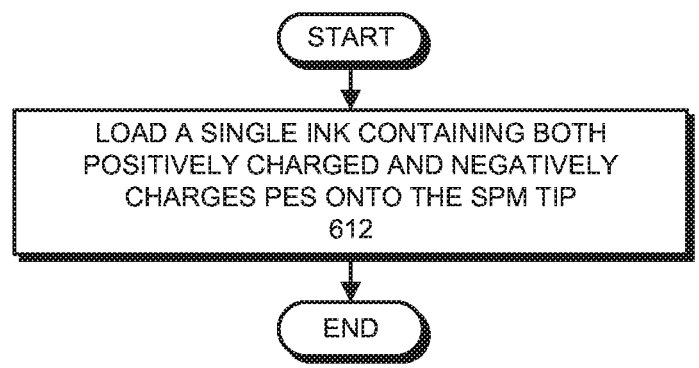
FIG. 6B presents a flow chart for the process of loading a single ink containing both a positively charged PE and a negatively charged PE onto the SPM tip in accordance with the disclosed embodiments.
Figure 6C:
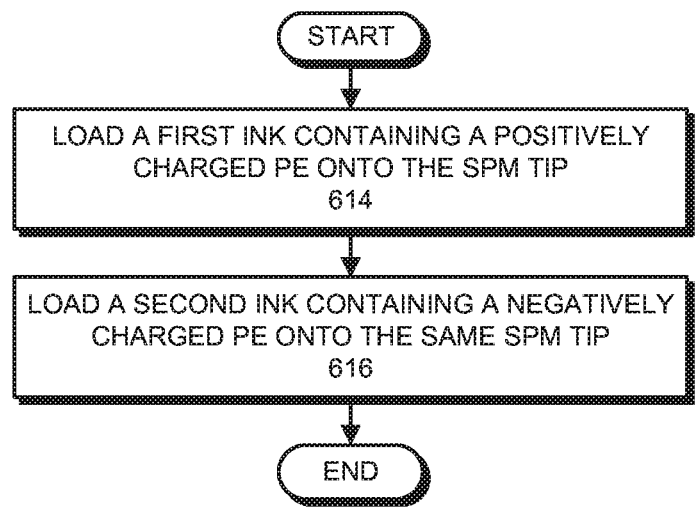
FIG. 6C presents a flow chart for the process of loading two inks containing positively charged and negatively charged PEs onto the SPM tip in accordance with the disclosed embodiments.

Note that the ink can be loaded onto the SPM tip using a number of different techniques. In a first technique, which is illustrated in the flow chart that appears in FIG. 6B, the system loads a single ink containing both positively charged and negatively charged PEs onto the SPM tip in accordance with the disclosed embodiments (step 612). In a second technique, which is illustrated in the flow chart that appears in FIG. 6C, the system loads a first ink containing a positively charged PE onto the SPM tip (step 614). Then, the system loads a second ink containing a negatively charged PE onto the same SPM tip (step 616).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for forming a three-dimensional (3D) nanostructure through 3D printing, comprising:
    performing a 3D printing operation that uses multiple passes of a scanning probe microscope (SPM) tip to deliver an ink to form the 3D nanostructure;
    wherein the ink includes both a positively charged polyelectrolyte (PE) and a negatively charged PE;
    wherein while delivering the ink, the SPM tip is loaded with the ink and moved to a target location to deposit the ink; and
    after the multiple passes are complete, curing the 3D nanostructure to remove excess positive or negative charges from the 3D nanostructure.

2. The method of claim 1, wherein loading the SPM tip with the ink involves loading a single ink containing both positively charged and negatively charged PEs onto the SPM tip.

3. The method of claim 1, wherein loading the SPM tip with the ink involves:
    loading a first ink containing a positively or negatively charged PE onto the SPM tip; and
    loading a second ink containing an oppositely charged PE on the same SPM tip.

4. The method of claim 1, wherein the ink is delivered layer-by-layer to form the 3D nanostructure, and wherein each layer is two-dimensional (2D) and comprises one or more of the following:

a plurality of dots;
a plurality of lines; and
a plurality of 2D geometries.

5. The method of claim 1, wherein the ink is delivered line-by-line to form the 3D nanostructure.

6. The method of claim 1, wherein curing the 3D nanostructure involves washing the 3D nanostructure with one or more of the following: water, methanol, ethanol, isopropanol, n-propanol, butanol, acetone, tetrahydrofuran, dimethylformamide, acetonitrile, ether, 1,4-dioxane, chloroform, diethyl ether, ethyl acetate, dimethyl sulfoxide, acetic acid, formic acid, and ammonium hydroxide.

7. The method of claim 1, wherein curing the 3D nanostructure involves aging the 3D nanostructure in air.

8. The method of claim 1, wherein the ink comprises:
the positively charged PE;
the negatively charged PE; and
a solvent.

9. The method of claim 8, where the solvent is selected from: water, methanol, ethanol, isopropanol, n-propanol, butanol, acetone, tetrahydrofuran, dimethylformamide, acetonitrile, ether, 1,4-dioxane, chloroform, diethyl ether, ethyl acetate, dimethyl sulfoxide, acetic acid, formic acid, and ammonium hydroxide.

10. The method of claim 8, wherein the ink includes a salt, which comprises ions selected from:
a group of positive ions comprising $Li^+$, $Na^+$, $K^+$, $Ca^{2+}$, $Mg^{2+}$, $Fe^{2+}$, $Fe^{3+}$, $Cu^{2+}$, $Zn^{2+}$, $Ag^+$, $Ba^{2+}$; and
a group of negative ions comprising $F^-$, $Cl^-$, $Br^-$, $CO_3^{2-}$, $ClO_4^-$, $PO_4^{3-}$, $NO_3^-$; $NO_2^-$, $S_2O_3^{2-}$, $SO_3^{2-}$, $SO_4^{2-}$.

11. The method of claim 1, wherein the positively charged PE is selected from a group comprising: poly(diallyldimethyl ammonium chloride), poly(allylamine) hydrochloride, poly(ethylenimine), poly(4-vinyl pyridine), polyaniline, polypyrrole, phenylbenzenamine, enzymes, basic polysaccharides, poly-(1,4)N-acetyl-D-glucosamine, cationic lipids, and polycarboxybetaine.

12. The method of claim 1, wherein the negatively charged PE is selected from a group comprising: poly(styrene sulfonate), poly(acrylic acid), sulfonated poly-p-phenylene azobenzene, acidic polysaccharides, polyuronides, alginic acid, carrageenans, hyaluronic acid, polylactic acid, polyglycolic acid, copolymers of organic acids.

13. The method of claim 1, wherein the ink includes a zwittorionic PE, which is selected from a group comprising: polynucleotides, peptides, proteins, peptide nucleic acids, enzymes, collagen, fibrin, proteoglycans.

14. The method of claim 1, wherein the ink includes a neutral PE, which is selected from a group comprising: polyacetylene, polythiophene, poly(3,4 ethylenedioxythiophene), poly(tetrafluoroethylene) carboxylate, poly(tetrafluoroethylene) phosphonate, polyphenylene vinylene, enzymes, polysaccharides, starch, cellulose, hemicelluloses, arabinoglucuronoxylan, galactans, agarose.

15. The method of claim 1, wherein after the 3D nanostructure is formed, the method further comprises performing an imaging operation to obtain an image of the 3D nanostructure.

\* \* \* \* \*